(12) United States Patent
Hanekawa et al.

(10) Patent No.: US 9,927,693 B2
(45) Date of Patent: Mar. 27, 2018

(54) REFLECTIVE MASK BLANK AND PROCESS FOR PRODUCING THE REFLECTIVE MASK BLANK

(71) Applicant: Asahi Glass Company, Limited, Chiyoda-ku (JP)

(72) Inventors: Hiroshi Hanekawa, Chiyoda-ku (JP); Junichi Kageyama, Chiyoda-ku (JP); Kazuyuki Hayashi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 30 days.

(21) Appl. No.: 15/266,538

(22) Filed: Sep. 15, 2016

(65) Prior Publication Data

US 2017/0082916 A1    Mar. 23, 2017

(30) Foreign Application Priority Data

Sep. 17, 2015   (JP) .................................. 2015-184035

(51) Int. Cl.
*G03F 1/24*   (2012.01)

(52) U.S. Cl.
CPC ...................................... *G03F 1/24* (2013.01)

(58) Field of Classification Search
None
See application file for complete search history.

(56) References Cited

FOREIGN PATENT DOCUMENTS

| WO | WO 2008/129914 A1 | 10/2008 |
|----|-------------------|---------|
| WO | WO 2009/130956 A1 | 10/2009 |
| WO | WO 2010/110237 A1 | 9/2010 |
| WO | WO 2012/121159 A1 | 9/2012 |
| WO | WO 2013/031863 A1 | 3/2013 |

OTHER PUBLICATIONS

Sungmin Huh et. al., "Printability and Inspectability of Programmed and Real Defects on the Reticle in EUV Lithography" 2010 International Symposium on Extreme Ultraviolet Lithography, Oct. 2010, 21 Pages.
P. Seidel et al. "EUVL ML Blank Fiducial Mark Standardization," EUVL mask fiducial SEMI Standard Discussion, Jan. 2006, 15 Pages.

*Primary Examiner* — Stephen Rosasco
(74) *Attorney, Agent, or Firm* — Oblon, McClelland, Maier & Neustadt, L.L.P.

(57) ABSTRACT

A reflective mask blank, which includes a substrate, a reflective multilayer film for reflecting exposure light, and an absorber layer for absorbing the exposure light in this order; the reflective multilayer film having at least three fiducial marks formed in a concave shape in an area outside an exposure area for patterning the reflective multilayer film on a front side thereof, each of the fiducial marks including a concave portion having an inclination angle α, the absorber layer having a film thickness of from 40 to 90 nm; the absorber layer having transferred marks formed in a concave shape on a front side thereof, the transferred marks being transferred from the at least three fiducial marks, each of the transferred marks including a concave portion having an inclination angle of from 35 to 80°; and a difference between the inclination angle β and the inclination angle α (inclination angle β−inclination angle α) being at least 10°.

10 Claims, 2 Drawing Sheets ns having a size of 40 nm or less, EUV exposure technology has been promising in place of the existing ArF exposure technology that uses ArF excimer laser light having a wavelength of 193 nm. The EUV exposure technology uses, as the exposure light, EUV (Extreme Ultra-Violet) light having a shorter wavelength than the ArF excimer laser light. The EUV light includes a soft X-ray and vacuum UV light, and is specifically light having a wavelength of from about 0.2 to 100 nm. At present, as the exposure light, EUV light having a wavelength of about 13.5 nm is mainly investigated.
REFLECTIVE MASK BLANK AND PROCESS FOR PRODUCING THE REFLECTIVE MASK BLANK

FIELD OF INVENTION

The present invention relates to a reflective mask blank and a process for producing a reflective mask blank.

BACKGROUND OF INVENTION

Recently, in order to make it possible to transfer micropatterns having a size of 40 nm or less, EUV exposure technology has been promising in place of the existing ArF exposure technology that uses ArF excimer laser light having a wavelength of 193 nm. The EUV exposure technology uses, as the exposure light, EUV (Extreme Ultra-Violet) light having a shorter wavelength than the ArF excimer laser light. The EUV light includes a soft X-ray and vacuum UV light, and is specifically light having a wavelength of from about 0.2 to 100 nm. At present, as the exposure light, EUV light having a wavelength of about 13.5 nm is mainly investigated.

In the EUV lithography (EUVL) technology, a reflective photomask is used. The reflective photomask includes a multilayer reflective film and an absorber layer formed in this order on a substrate with the absorber layer being partially removed. The absorber layer is formed in a prescribed pattern. EUV light incident on the reflective photomask is absorbed in an area of the photomask with the absorber layer being present and is reflected by the multilayer reflective film in the other area with the absorber layer being absent such that an image is formed on the front side of an exposure material by an optical system. In that manner, the pattern of the absorber layer is transferred to the front side of the exposure material.

The multilayer reflective film has a periodic structure such that a plurality of films having different refractive indexes are repeatedly stacked on a substrate in a prescribed order. For example, the multilayer reflective film has Mo layers as low-refractivity layers and Si layers as high-refractivity layers alternately and repeatedly stacked therein.

In a case where a multilayer reflective film is contaminated with a foreign substance during production of the multilayer reflective film by stacking, or in a case where a defect (e.g. a foreign substance, a scratch or a pit) is present on the front side of a substrate to be provided with the multilayer reflective film thereon, the periodic structure of the multilayer reflective film is disordered to cause a defect (so-called phase defect) in the multilayer reflective film. Such a defect causes a problem in that the pattern of a reflective photomask is not correctly transferred to a wafer. It is extremely technically difficult to absolutely remove such a defect from the multilayer reflective film (e.g. see 2010 International Symposium on Extreme Ultraviolet Lithography, S. Huh et. al., "Printability and Inspectability of Programmed and Real Defects on the Reticle in EUV Lithography").

From this point of view, investigation has been made to develop a technique of controlling the position and the direction of the pattern of an absorber layer in accordance with the position of such a defect in the multilayer reflective film (e.g. see EUVL Mask Fiducial SEMI Standard Discussion January 2006, P. Seidel and P. Y. Yan).

Further, in order to accurately identify the position of such a defect in a multilayer reflective film, there has been proposed a technique of forming fiducial marks, in advance, on a front side of a substrate with the multilayer reflective film deposited thereon or on a mark formation thin film formed on the substrate (e.g. see WO-A-2010-110237). The fiducial marks are transferred to the multilayer reflective film such that the position of such a defect in the multilayer reflective film can be identified based on the positions of transferred fiducial mark as reference positions.

Apart from the above, there has also been proposed a technique of identifying the position of a defect in a multilayer reflective film and repairing the defect in the multilayer reflective film (e.g. see WO-A-2008-129914). This publication recites that, when an absorber layer is deposited on a multilayer reflective film, fiducial marks are formed on the absorber layer but are not formed on the substrate nor the multilayer reflective film.

WO-A-2009-130956, WO-A-2012-121159 and WO-A-2013-031863 also disclose that fiducial marks or positioning marks are formed on an absorber layer. WO-A-2013-031863 also discloses that fiducial marks are formed on a reflective layer or a protective layer of the reflective layer, followed by forming an absorber layer on the reflective film or the protective layer with the marks formed thereon. WO-A-2012-121159 and WO-A-2013-031863 also disclose that temporary fiducial marks are formed on a substrate to identify the position of a defect on the substrate using temporary fiducial marks as reference positions.

SUMMARY OF INVENTION

Technical Problem

The position of a defect in a multilayer reflective film is identified by using the positions of fiducial marks as reference positions. The conventional fiducial marks have been, however, difficult to use the position of fiducial marks as a reference position in order to identify the position of a defect with good accuracy because the reproducibility of a detected position with inspection light is not sufficient.

Further, when fiducial marks are, in advance, formed on the front side of a substrate to be provided with a reflective multilayer film as the technique disclosed in WO-A-2010-110237, a foreign substance, which is generated by processing for forming fiducial marks, is apt to adhere to the front side of the substrate to cause a new defect.

When fiducial marks are formed on the front side of a substrate or on a mark formation thin film, functional films, such as a reflective multilayer film and an absorber layer, are formed on the fiducial marks. In this case, although the shapes of the fiducial marks are transferred on these functional films, it is supposed that the width and depth of the fiducial marks decrease according to the thickness of the functional films, resulting in a decrease in contrast. For this reason, it is supposed that the detectability of the fiducial marks is reduced.

When concave fiducial marks are formed on an absorber layer as disclosed in WO-A-2008-129914, WO-A-2009-130956, WO-A-2012-121159 and WO-A-2013-031863, the fiducial marks are required to be formed so as to have a certain depth in order to increase the detectability of the fiducial marks. In the other hand, when the fiducial marks have a larger depth than the thickness of an absorber layer, the fiducial marks are formed so as to extend through the absorber layer such that a plurality of kinds of film materials, such as a reflective multilayer film, and a protective layer for the reflective multilayer film, are processed. In this case, the edge shape of the fiducial marks is supposed to be disturbed to reduce the detectability of the fiducial marks because the respective film materials have different processing efficiencies, being affected by the differences in the film forming materials or the presence of a plurality of interfaces.

In this regard, an absorber layer is required to have a reduced thickness in order to reduce the shadowing effect, which means that it is highly likely that the above-mentioned problem will be significant in the future. It should be noted that the shadowing effect is a phenomenon that in a case where EUV light obliquely enters a reflective mask and is obliquely reflected on the mask, when an absorber layer pattern has a large thickness, the incident light and the reflected light are shielded to introduce a change in the size of a transferred pattern or a reduction in clearness, which has become significant due to pattern miniaturization.

According to the technique disclosed in WO-A-2010-110237, a dry etching process can be carried out to form fiducial marks so as to provide the fiducial marks with increased detectability in comparison with fiducial marks formed by use of another technique, such as laser illumination. There are, however, limitations to the shape and the size of fiducial marks capable of being formed when the fiducial marks are formed by use of a dry etching process. For example, it has been difficult to form fiducial marks in a submicron order. In the dry etching process, in order to protect an area with fiducial marks formed therein and surroundings thereof, a resist is applied to the area and the surroundings, followed by being stripped from these areas after carrying out the process. During stripping, it is concerned that the surface quality of these areas may be adversely affected because these areas with the fiducial marks formed therein are exposed to a resist stripper.

WO-A-2012-121159 and WO-A-2013-031863 recite that it is preferred to use a FIB (Focused Ion Beam) method because this method makes it possible to carry out microprocessing.

The fiducial marks formed by use of the FIB method, however, trends to have a lower detectability than the fiducial marks formed by use of a dry etching process.

In some cases, a metal oxide film is formed as a low reflective layer on an absorber layer for inspection light for a mask pattern. In such cases, the low reflective layer formed on the absorber layer is also processed by use of the FIB method. When the FIB method is applied to the metal oxide film formed as the low reflective layer, it is, however, supposed that the beam shape is made unstable, being affected by the charge-up caused in the metal oxide film such that the edge shape of the fiducial marks is disturbed to reduce the detectability.

The present invention is proposed in consideration of the above-mentioned problems. It is an object of the invention to provide a reflective mask blank, which is capable of identifying the position of a defect therein, in particular the position of a defect on or in a reflective multilayer film with good accuracy, and a process for producing such a reflective mask blank.

Solution to Problem

In order to attain the object, the inventors have investigated the reason why the fiducial marks formed by use of the FIB method has a lower detectability than the fiducial marks formed by use of a dry etching process, and have found the following findings.

When the FIB method is carried out under normal conditions, the resulting fiducial marks are formed in a concave shape such that each of the fiducial marks has a sidewall inclined so as to spread toward the top thereof. At this time, the inclined sidewall has a smaller inclined angle than 90° to the bottom surface of the concave portion forming each of the fiducial marks. In an area where the sidewall is inclined, it is impossible to obtain sufficient contrast to inspection light because the depth of each of the fiducial marks gradually changes. The inventors have found that the fiducial marks produced under normal conditions are low in detectability for this reason. In the techniques disclosed in WO-A-2012-121159 and WO-A-2013-031863, the FIB method is used to form fiducial marks such that each of the fiducial marks has a large inclination angle at an edge portion with a sidewall extending substantially vertically with respect to a front side with the fiducial mark formed therein. When the FIB method is used to form such fiducial marks, the processing, however, requires a long time because the necessity of a reduction in a probe current leads to a large reduction in the processing rate. This causes a problem of a reduction in throughput when reflective mask blanks are produced in an industrial scale by use of this method. Further, the processing by the FIB method for a long time could damage the front side with the fiducial marks formed therein.

Also in a case where a dry etching process is used to form fiducial marks, when the process is carried out under normal conditions, the process leads to a reduction in the inclination angle at the boundary (the edge portion of each fiducial mark) between a front side where the fiducial mark is formed (bottom surface) and the sidewall of the fiducial mark in a concave shape. When an attempt is made to form fiducial marks such that each of the fiducial marks has a large inclination angle at an edge portion with a sidewall extending substantially vertically with respect to a front side with the fiducial mark formed therein, the processing by use of a dry etching process could damage the front side with the fiducial marks formed therein.

The present invention is proposed based on the above-mentioned findings and provides a reflective mask blank, which includes a substrate, a reflective multilayer film for reflecting exposure light, and an absorber layer for absorbing the exposure light in this order; the reflective multilayer film having at least three fiducial marks formed in a concave shape in an area outside an exposure area for patterning the reflective multilayer film on a front side thereof, each of the fiducial marks including a concave portion having an inclination angle $\alpha$, the absorber layer having a film thickness of from 40 to 90 nm; the absorber layer having transferred marks formed in a concave shape on a front side thereof and being formed in a concave shape, the transferred marks being transferred from the at least three fiducial marks, each of the transferred marks including a concave portion having an inclination angle $\beta$ of from 35 to 80°, and a difference between the inclination angle $\beta$ and the inclination angle $\alpha$ (inclination angle $\beta$–inclination angle $\alpha$) being at least 10°.

It is preferred that the concave portion of the transferred marks have a depth of at least 50 nm in the reflective mask blank according to the present invention.

It is preferred that the inclination angle $\alpha$ be from 25 to 45° in the reflective mask blank according to the present invention.

It is preferred that the at least three fiducial marks be not present on a single imaginary linear line on the reflective multilayer film in the reflective mask blank according to the present invention.

The present invention also provides a process for producing the reflective mask blank according to the present invention, which includes using a FIB (Forced Ion Beam) method or a dry etching process to form at least three concave fiducial marks on a reflective multilayer film in an area outside an exposure area for patterning the reflective multilayer film on a front side of the reflective multilayer film; and forming an absorber layer on the reflective multilayer film by sputtering after formation of the at least three fiducial marks such that the at least three fiducial marks are transferred onto the absorber layer.

It is preferred that the forming of the absorber layer by sputtering be carried out under a pressure of at most 0.3 Pa in the process for producing the reflective mask blank according to the present invention.

In accordance with the present invention, there are provided a reflective mask blank, which is capable of identifying the position of a defect on or in a reflective multilayer film with good accuracy, and a process for producing such a reflective mask blank.

DETAILED DESCRIPTION OF INVENTION

Figure 1:
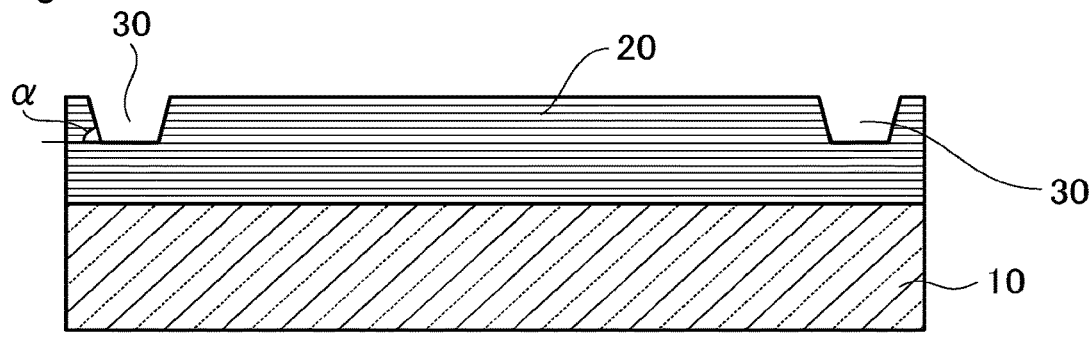
FIG. 1 is a cross-sectional view showing the reflective mask blank according to an embodiment of the present invention before formation of an absorber layer.

Embodiments of the present invention will be described below in reference to the accompanying drawings where the same or corresponding elements are denoted by the same or corresponding reference numerals. With regard to the elements denoted by the same or corresponding reference numerals, explanation of these elements will not be made in an overlapping manner.

Although explanation of the embodiments described below will be made about a reflective mask blank for EUVL, the present invention is also applicable to a reflective mask blank which uses light having a wavelength other than EUV light.

The entire structure of the reflective mask blank according to the present invention will be described in reference to FIG. 3.

Figure 3:
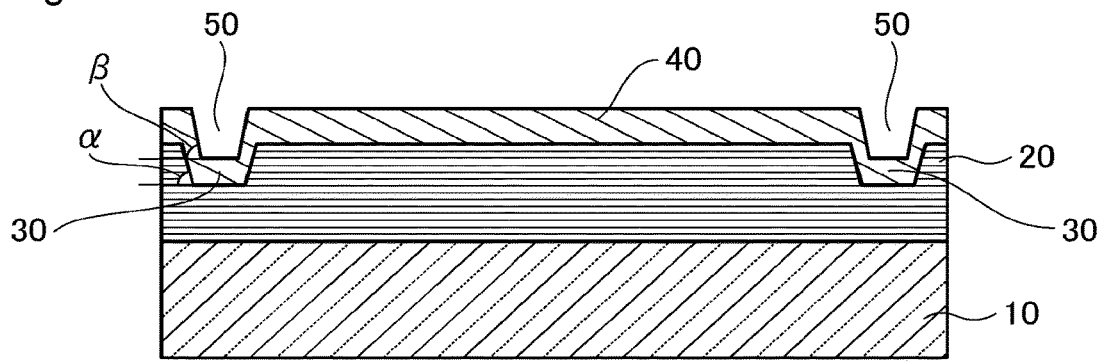
FIG. 3 is a view similar to FIG. 1 after formation of the absorber layer, though.

The reflective mask blank shown in FIG. 3 includes a substrate 10, a reflective multilayer film 20 for reflecting EUV light, and an absorber layer 40 for absorbing EUV light in this order.

Figure 2:
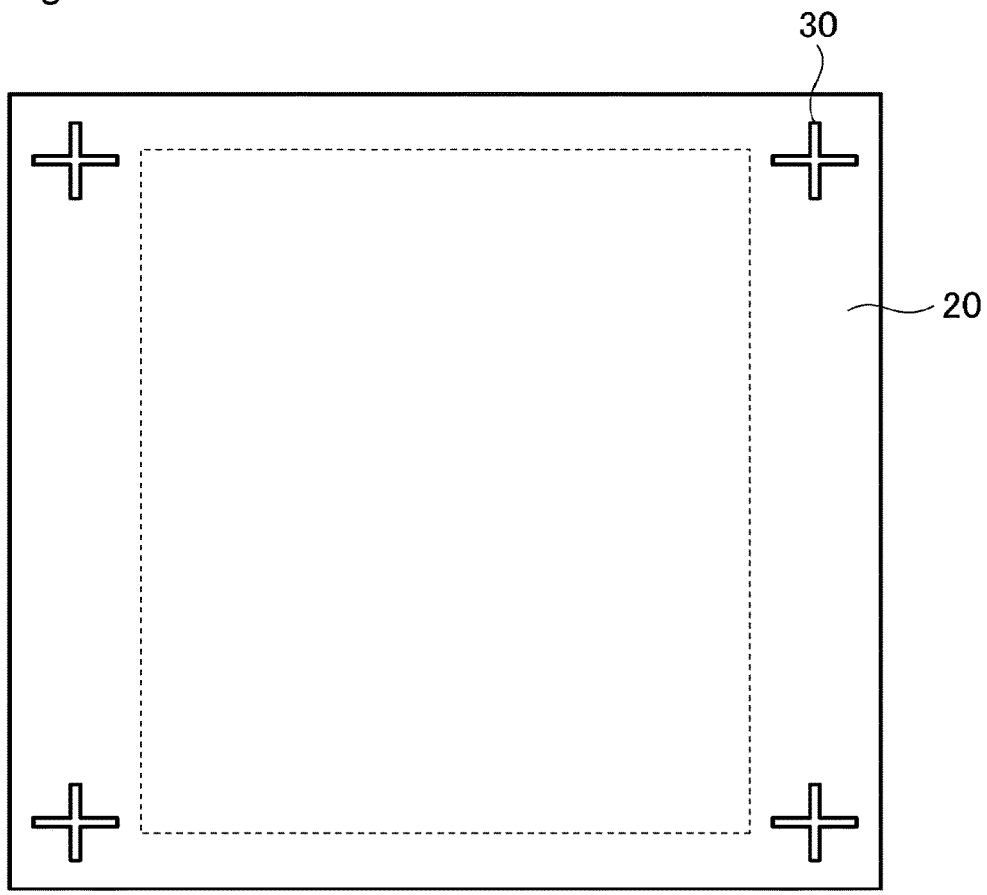
FIG. 2 is a plan view of the reflective mask blank shown in FIG. 1.
Figure 4:
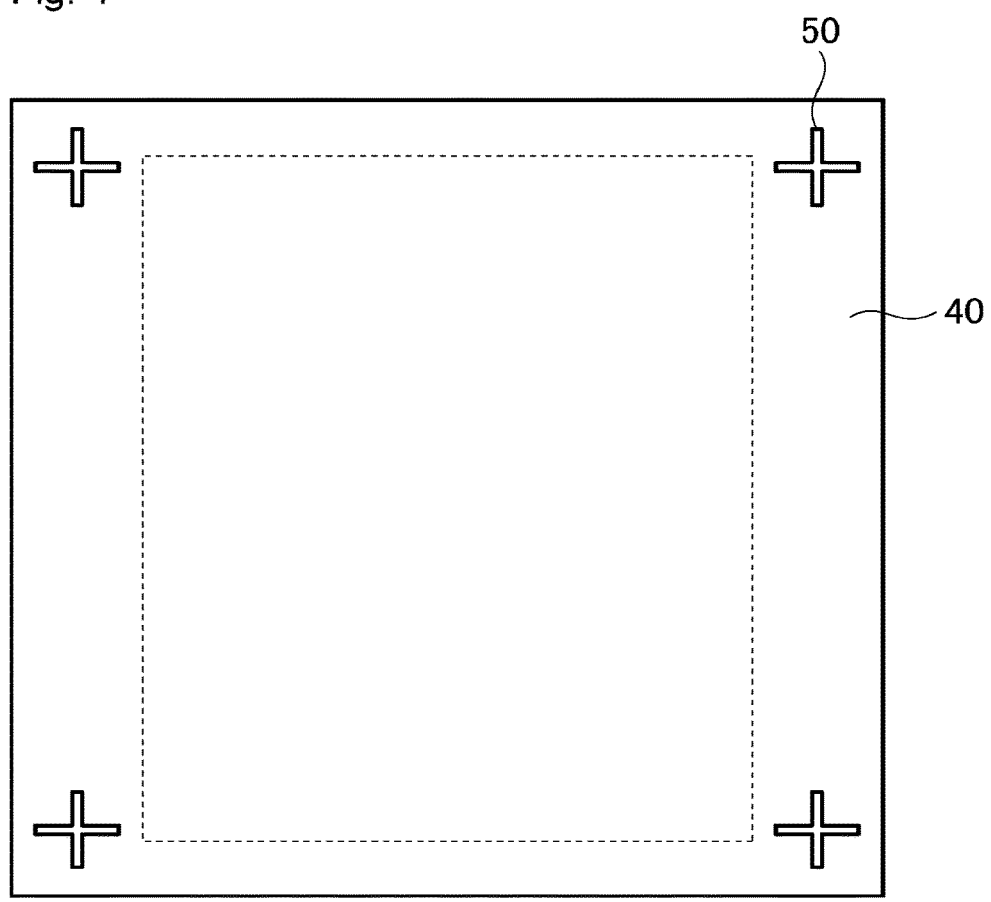
FIG. 4 is a plan view of the reflective mask blank shown in FIG. 3.

As shown in FIGS. 1 and 2, the reflective mask blank according to the present invention has fiducial marks 30 formed on a front side of the reflective multilayer film 20. As shown in FIGS. 3 and 4, the marks 50 transferred from the fiducial marks 30 (transferred marks) are formed on the absorber layer 40 and are formed in a concave shape.

The transferred marks 50 are utilized to identify the position of a defect present on or in the reflective multilayer film 20, using transferred marks 50 as reference positions for defect inspection of the reflective mask blank.

It should be noted that the transferred marks 50 are formed on a part of a front side of the absorber layer 40 outside an exposure area for patterning because when the transferred marks 50 are present in the exposure area during patterning, it is likely that a transferred mark 50 is detected as being a defect on the reflective mask blank by a defect inspection tool for defect inspection of the reflective mask blank. For this reason, the fiducial marks 30 are also formed on a part of the front side of the reflective multilayer film 20 outside the exposure area for patterning.

The exposure area for patterning varies depending on the dimensions of substrates or required specifications related to the exposure area during patterning. In the case of a substrate having dimensions of 152.0 mm by 152.0 mm that is normally employed as the substrate 10 for the EUVL reflective mask blank, the exposure area has dimensions of 132 mm by 104 mm. Accordingly, the fiducial marks 30 are formed outside of this exposure area. The exposure area is normally located in a central portion of a substrate.

Hereinbelow, when it is described that the fiducial marks are formed on the front side of the reflective multilayer film, it means that the fiducial marks are formed on a part of the front side of the reflective multilayer film outside the exposure area for patterning.

Although the fiducial marks 30 are formed at four corners on the part of the front side of the reflective multilayer film 20 outside the exposure area for patterning in the shown embodiment, there is no limitation to the positions to form the fiducial marks as long as the positions are located outside the exposure area for patterning. For example, a fiducial mark may be formed at a position between adjacent fiducial marks 30 shown in FIG. 2.

In the reflective mask blank shown in FIGS. 2 and 4, the fiducial marks 30 are formed at four positions on the front side of the reflective multilayer 20, and the transferred marks 50 are formed at four positions on the front side of the absorber layer 40. It should be noted that it is sufficient that the reflective mask blank according to the present invention has at least three fiducial marks formed on the front side of the reflective multilayer film. In other words, the absorber layer has at least three transferred marks formed on the front side thereof. The reason why the reflective multilayer film is required to have at least three fiducial marks formed on the front side thereof is as follows:

The transferred marks 50 formed on the front side of the absorber layer 40 are utilized to identify the position of defect present on or in the reflective multilayer film 20, using transferred marks 50 as reference positions for defect inspection of the reflective mask blank as described above. More specifically, the transferred marks 50 are utilized to identify the position of a defect present on or in the reflective multilayer 20 as a relative position with respect to an axis connecting between transferred marks 50. In order to accurately identify the position of a defect present on or in the reflective multilayer film 20, at least two axes are needed. For this reason, the transferred marks 50 needed to be present at at least three positions. This requires that the fiducial marks 30 be formed at least three positions on the front side of the reflective multilayer 20. It is preferred that the three fiducial mark be positioned so as not to be present on a single imaginary straight line on the front side of the reflective multilayer film.

The transferred marks 50 formed on the front side of the absorber layer 40 are required to have a high detectability for defect inspection of the reflective mask blank for the above-mentioned reason. In the reflective mask blank according to the present invention, the concave portion forming each of the transferred marks 50 has an inclination angle $\beta$ of from 35 to 80°. As shown in FIG. 3, the inclination angle $\beta$ of the concave portion forming each of the transferred marks 50 is an inclination angle between the bottom surface and the lateral surface forming an inclination surface of the concave portion. When the concave portion forming each of the transferred marks 50 has an inclination angle $\beta$ of from 35 to 80°, the detectability is high during defect inspection of the reflective mask blank. On the other hand, when the concave portion forming each of the transferred marks 50 has an inclination angle β of less than 35° or larger than 80°, the detectability decreases during defect inspection of the reflective mask blank. The concave portion forming each of the transferred marks 50 has an inclination angle β formed preferably from 40 to 75°, more preferably from 50 to 65°.

The inclination angle β of the concave portion forming each of the transferred marks 50 is affected by the inclination angle α of the concave portion forming each of the fiducial mark 30 as the original. From this point of view, it is preferred in theory that the inclination angle α of the concave portion forming each of the fiducial marks 30 is substantially within the above-mentioned range of the inclination angle β of the concave portion forming each of the transferred marks 50.

It is, however, difficult for the reason described below that the inclination angle α of the concave portion forming each of the fiducial mark 30 is set substantially within the above-mentioned range of the inclination angle β of the concave portion forming each of the transferred marks 50. It should be noted that the inclination angle α of the concave portion forming each of the fiducial marks 30 is an inclination angle between the bottom surface and the lateral surface forming an inclination surface of the concave portion as shown in FIGS. 1 and 3.

The fiducial marks 30 that require a high dimensional accuracy and a high form accuracy are formed by use of the FIB method or a dry etching process. When the fiducial marks 30 are formed by either one of the methods, the inclination angle α of the concave portion forming each of the fiducial marks 30 is made small for the reason stated below.

In order to increase the inclination angle α of the concave portion forming each of the fiducial marks 30 when forming the concave fiducial marks 30 by use of the FIB method, it is necessary to reduce the probe current during implementation of the FIB method. It, however, takes a long time to finish the processing because a reduction in the probe current during implementation of the FIB method leads a large reduction in the processing rate. This causes a problem of a reduction in throughput when reflective mask blanks are produced in an industrial scale by use of this method. Further, the processing by the FIB method for a long time could damage the front side with the fiducial marks formed thereon.

On the other hand, also in a case where the fiducial marks 30 are formed by use of the dry etching process, when an attempt is made to increase the inclination angle α of the concave portion forming each of the fiducial marks 30, the processing by the dry etching process could damage the front side with the fiducial marks 30 formed thereon. In particular, the processing could have an adverse effect on the surface quality of the sidewall of the concave portion forming each of the fiducial marks 30 such that the detectability of the fiducial marks 30 is reduced.

From this point of view, in the reflective mask blank according to the present invention, the inclination angle α of the concave portion forming each of the fiducial marks 30 is preferably from 25 to 45°, more preferably from 25 to 35°. When an attempt is made such that the inclination angle α of the concave portion forming each of the fiducial marks 30 is made larger than 45°, the above-mentioned problems, which are caused when forming the fiducial marks 30 by use of the FIB method or the dry etching process, are likely to be caused. On the other hand, when the inclination angle α of the concave portion forming each of the fiducial marks 30 is smaller than 25°, it becomes difficult that the inclination angle β of the concave portion forming each of the transferred marks 50 is within the above-mentioned range. The inclination angle β of the concave portion forming each of the transferred marks 50 is preferably from 40 to 75°, more preferably from 50 to 65°.

The inclination angle α of the concave portion forming each of the fiducial marks 30 and the inclination angle β of the concave portion forming each of the transferred marks 50 may be measured by the following method:

A fiducial mark 30 formed on the front side of the reflective multilayer film 20 and the corresponding transferred mark 50 formed on the front side of the absorber layer 40 are cut in a direction perpendicular to a longitudinal direction of the marks, and the marks are observed in sectional images by a scanning electron microscope (SEM). The respective cross-sectional images are binarized. Edge points of the bottom surface and the inclination surface of the concave portion forming the fiducial mark 30 are extracted. Edge points of the bottom surface and the inclined surface of the concave portion forming the corresponding transferred mark 50 are extracted. Approximate linear lines are found based on the extracted edge points by the least-squares method. The angle defined by the approximate linear line of the bottom surface of the concave portion forming the fiducial mark 30 and the approximate linear line of the inclination surface of the concave portion forming the fiducial mark 30 are defined as the inclination angle α while the angle defined by the approximate linear line of the bottom surface of the concave portion forming the corresponding transferred mark 50 and the approximate linear line of the inclination surface of the concave portion forming the corresponding transferred mark 50 are defined as the inclination angle β.

In the reflective mask blank according to the present invention, the absorber layer 40 is formed on the reflective multilayer film 20 so as to satisfy certain conditions such that the inclination angle β of the concave portion forming each of the marks transferred from the fiducial marks 30 (transferred marks) 50 becomes larger than the inclination angle α of the concave portion forming each of the fiducial marks 30. As a result, the detectability increases in defect inspection of the reflective mask blank. In the reflective mask blank of the present invention, the detectability of the transferred marks 50 is high in defect inspection of the reflective mask blank since the difference between the inclination angle β of the concave portion forming each of the transferred marks 50 and the inclination angle α of the concave portion forming each of the corresponding fiducial marks 30 (inclination angle β−inclination angle α) is at least 10°. The difference between the inclination angle β of the concave portion forming each of the transferred marks 50 and the inclination angle of the concave portion forming each of the corresponding fiducial marks 30 (inclination angle β−inclination angle α) is preferably at least 15°, more preferably at least 20°. Further, the difference between the inclination angle β of the concave portion forming each of the transferred marks 50 and the inclination angle α of the concave portion forming each of the corresponding fiducial marks 30 (inclination angle β−inclination angle α) is preferably at most 40°, more preferably at most 35°.

In the reflective mask blank according to the present invention, one of the certain conditions described above is the film thickness of the absorber layer 40. When the film thickness of the absorber layer 40 meets a certain condition, the inclination angle β of the concave portion forming each of the transferred marks 50 becomes greater than the inclination angle α of the concave portion forming each of the fiducial marks 30.

In the reflective mask blank according to the present invention, the absorber layer 40 has a film thickness of from 40 to 90 nm. When the absorber layer 40 has a film thickness within the above-mentioned range, the inclination angle β of the concave portion forming each of the transferred marks 50 becomes greater than the inclination angle α of the concave portion forming each of the corresponding fiducial marks 30 such that the difference between the inclination angle β of the concave portion forming each of the transferred marks 50 and the inclination angle α of the concave portion forming each of the corresponding fiducial marks 30 (inclination angle β–inclination angle α) meets the above-mentioned condition.

When the absorber layer 40 has a film thickness of less than 40 nm or greater than 90 nm, the difference between the inclination angle β of the concave portion forming each of the transferred marks 50 and the inclination angle α of the concave portion forming each of the corresponding fiducial marks 30 (inclination angle β–inclination angle α) does not meet the above-mentioned condition.

The absorber layer 40 has a film thickness of preferably from 45 to 85 nm, more preferably from 50 to 80 nm.

In order to improve the detectability of the transferred marks 50 in the defect inspection of the reflective blank mask according to the present invention, it is preferred that the concave portion forming each of the transferred marks 50 have a depth of at least 50 nm. The concave portion forming each of the transferred marks 50 has a depth of more preferably at least 60 nm, furthermore preferably at least 70 nm.

As being clear from the above-mentioned explanation, as the depth of the concave portion forming each of the transferred marks 50 increases, the detectability of the transferred marks 50 is improved in defect inspection of the reflective mask blank. It should be, however, noted that the depth of the concave portion forming each of the transferred marks 50 depends on the depth of the concave portion forming each of the corresponding fiducial marks 30 as the original marks. When the absorber layer 40 has a film thickness within the above-mentioned range, the depth of the concave portion forming each of the transferred marks 50 is in substantial conformity to the depth of the concave portion forming each of the corresponding fiducial marks 30 as the original marks. For this reason, the depth of the concave portion forming each of the fiducial marks 30 needs to increase in order that the depth of the concave portion forming each of the corresponding transferred marks 50 increases. When the depth of the concave portion forming each of the fiducial marks 30 excessively increases, the time required for formation of the fiducial marks 30, however, increases, which causes a problem of a reduction in throughput when the reflective mask blanks are produced in an industrial scale by use of this method. As described above, the fiducial marks 30 are formed by use of the FIB method or the dry etching process. In either one of the processes, the processing for a long time could damage the front side with the fiducial marks formed therein.

From this point of view, the concave portion forming each of the transferred marks 50 has a depth of preferably at most 300 nm, more preferably at most 200 nm, further preferably of at most 120 nm.

Each of the transferred marks 50 shown in FIG. 4 has a planar form in a cross shape. When each of the transferred marks 50 has a planar form in a cross shape, it is easy to identify a reference point that actually function as a reference position in defect inspection of the reflective mask blank 1. In the transferred marks 50 having a planar form in a cross shape, the interception point of two axes forming a cross shape serves as a reference point. Even when two axes do not form a cross shape in a strict sense unlike the fiducial marks shown in FIG. 4 of WO-A-2008-129914, it is sufficient that the two axes are visually considered as forming a cross shape.

Each of the fiducial marks 30 also has a planar form in a cross shape as shown in FIG. 2 since the planar form of the transferred marks 50 is in conformity to the planar form of the fiducial marks 30 as the original marks.

It should be noted that the planar form of the fiducial marks and the planar form of the transferred marks in the reflective mask blank according to the present invention is not limited to such a shape and that these planar forms may have another shape, such as a similar shape with one of the four branches of the cross being missing.

The dimensions of the transferred marks and the dimensions of the fiducial marks as the original marks may be arbitrarily variable as long as the dimensions are in a dimensional range that maintains the detectability of the transferred marks. From the viewpoint that an increase in the dimensions extends the processing time, the two axes forming a cross shape has a length of preferably at most 4 mm, more preferably at least 1 mm. Likewise, the two axes forming a cross shape has a width of preferably at most 4 μm, more preferably 1 μm.

Now, the reflective mask blank according to the present invention will be further described.

Substrate

The substrate 10 is required to meet the characteristics required as the substrate for an EUVL reflective mask blank. From this point of view, it is preferred that the substrate 10 have a low thermal expansion coefficient (specifically, a thermal expansion coefficient of preferably $0\pm0.05\times10^{-7}/°$ C., more preferably $0\pm0.03\times10^{-7}/°$ C. at 20° C.) and excellent in smoothness, flatness and resistance to a cleaning liquid used for cleaning a mask blank or a photomask subjected to patterning.

The substrate 10 is made of glass, specifically, having a low thermal expansion coefficient, such as $SiO_2$—$TiO_2$ based glass. The material used for the substrate is not limited to such glass. The substrate may be a substrate made of crystallized glass having a β-quartz solid solution deposited therein, quartz glass, silicon or metal.

In order to provide a patterned photomask with a high reflectability and transfer accuracy, the substrate 10 has a smooth surface having a root mean square roughness Rq of preferably at most 0.15 nm and a flatness of at most 100 nm.

The dimensions and the thickness of the substrate 10 may be properly determined according to the design values etc. of a desired mask. In each of the examples described later, the substrates were made of $SiO_2$—$TiO_2$ based glass having outer dimensions of 6 inch (152 mm) square and a thickness of 0.25 inch (6.3 mm).

Reflective Multilayer Film

There is no limitation to the reflective multilayer film 20 formed on a substrate 10 as long as the film has desired characteristics required for a reflective multilayer film for an EUVL reflective mask blank. The characteristic particularly required for the reflective multilayer film 20 is a high reflectivity with respect to EUV light. Specifically, the reflective multilayer film 20 has a maximum reflectability of preferably at least 60%, more preferably at least 63%, furthermore preferably at least 65% when having the front side irradiated with a ray in the wavelength range of EUV light at an incident angle of 6°.

Examples of the reflective multilayer film layer 20 that meet the above-mentioned characteristics are listed below:

a Si/Mo reflective multilayer film with Si films and Mo films alternately stacked therein a Be/Mo reflective multilayer film with Be films and Mo films alternately stacked therein a Si compound/Mo compound reflective multilayer film with Si compound layers and Mo compound layers alternately stacked therein a Si/Mo/Ru reflective multilayer film with a Si film, a Mo film and a Ru film stacked in this order therein a Si/Ru/Mo/Ru reflective multilayer film with a Si film, a Ru film, a Mo film and a Ru film stacked in this order therein.

The film thickness of each of the layers forming the reflective multilayer film and the number of the repeating units of the layers may be properly selected according to the respective used film materials and the reflectivity required for each of the reflective layers with respect to EUV light. When a Mo/Si reflective multilayer film is exemplified, in order that the reflective multilayer film has a maximum reflectivity at least 60% with respect to EUV light, the reflective multilayer film may be configured such that Mo films having a film thickness 2.3±0.1 nm and Si films having a film thickness of 4.5±0.1 nm are stacked in from 30 to 60 of repeating units.

Each of the layers forming the reflective multilayer film may be deposited to have a desired thickness by use of a known dry film deposition method, such as a magnetron sputtering method or an ion beam sputtering method. For example, when a Mo/Si reflective multilayer film is formed by use of an ion beam sputtering method, the film deposition is preferably carried out as follows: A Si target is used as the first target, and an Ar gas (having a gas pressure of from $1.3 \times 10^{-2}$ Pa to $2.7 \times 10^{-2}$ Pa) is used as the first sputtering gas to deposit an Si film so as to have a thickness of 4.5 nm at an ion accelerating voltage of from 300 to 1,500 V and at a deposition rate of from 0.03 to 0.30 nm/sec. Next, a Mo target is used as the second target, and an Ar gas (having a gas pressure of from $1.3 \times 10^{-2}$ Pa to $2.7 \times 10^{-2}$ Pa) is used as the second sputtering gas to deposit a Mo film so as to have a thickness of 2.3 nm at an ion accelerating voltage of from 300 to 1,500 V and at a deposition rate of from 0.03 to 0.30 nm/sec. These steps form one cycle. The Mo/Si reflective multilayer film is deposited by stacking such Si films and such Mo films at cycles of from 30 to 60.

Formation of Fiducial Marks

As described above, in the reflective mask blank according to the present invention, the concave fiducial marks 30 are formed at certain positions on the front side of a reflective multilayer film by use of a FIB method or a dry etching process.

The reflective mask blank according to the present invention may have a protective layer formed between the reflective multilayer film 20 and the absorber layer 40. The protective layer is formed for the purpose of protecting the reflective multilayer film 20 in order to prevent the reflective multilayer film 20 from being damaged by etching when the absorber layer 40 is etched (normally dry etched) to be patterned. From this point of view, as the material for the protective layer is selected a substance which is difficult to be affected by the etching of the absorber layer 40, in other words, has a lower etching rate than the absorber layer 40 and is difficult to be damaged by the etching. Examples of the substance that meets these conditions include Cr, Al, Ta, a nitride thereof; Ru and a Ru compound (such as RuB or RuSi); $SiO_2$, $Si_3N_4$, $Al_2O_3$ or a mixture thereof. Among them, Ru, a Ru compound (such as RuB or RuSi), CrN and $SiO_2$ are preferred, and Ru and a Ru compound (such as RuB or RuSi) are particularly preferred.

When the protective layer is formed, the protective layer has a thickness of preferably from 1 to 60 nm, more preferably from 1 to 40 nm.

When the protective layer is formed, the protective layer may be deposited by use of a known dry film deposition method, such as a magnetron sputtering method or an ion beam sputtering method. When the Ru film is deposited by use of a magnetron sputtering method, a film deposition may be preferably carried out under the following conditions:

Target: Ru target

Sputtering gas: Ar gas (having a gas pressure from $1.0 \times 10^{-2}$ Pa to $10 \times 10^{-1}$ Pa)

Input power: from 30 to 1,500 V

Deposition rate: from 1.2 to 60 nm/min

Film thickness: from 2 to 5 nm

Even when the protective layer is formed on the reflective multilayer film 20, the reflective multilayer film has a maximum reflectivity of preferably at least 60%, more preferably at least 63%, furthermore preferably at least 65% with respect to a ray having a wavelength of about 13.5 nm.

When the protective layer is formed on the reflective multilayer film 20, the protective layer has the fiducial marks formed in a concave shape or a convex shape at certain positions on the front side thereof.

Absorber Layer

The characteristics particularly required for the absorber layer 40 is that the absorber layer has an extremely low reflectivity with respect to EUV light. Specifically, the absorber layer has a maximum reflectivity of preferably at most 6% with respect to light having a wavelength of about 13.5 nm when the absorber layer 40 has the front side irradiated with a ray in the wavelength range of EUV light.

In order to attain the above-mentioned characteristics, the absorber layer 40 is made by a material having a high absorption coefficient with respect to EUV light. It is preferred to use a material including tantalum (Ta) as a main component as such a material having a high absorption coefficient with respect to EUV light. In Description, the material including tantalum (Ta) as a main component means a material containing Ta in an amount of at least 40 at %. The absorber layer 40 contains Ta in an amount at least 50 at %, more preferably at least 55 at %.

The material containing Ta as a main component to form the absorber layer 40 preferably contains, in addition to Ta, at least one kind of component among hafnium (Hf), silicon (Si), zirconium (Zr), germanium (Ge), boron (B), palladium (Pd), hydrogen (H) and nitrogen (N). Specific examples of the material containing at least one of these elements in addition to Ta include TaN, TaNH, TaHf, TaHfN, TaBSi, TaBSiN, TaB, TaBN, TaSi, TaSiN, TaGe, TaGeN, TaZr, TaZrN, TaPd and TaPdN.

Although the absorber layer 40 in the reflective mask blank according to the present invention has a film thickness of from 40 to 90 nm as described above, the preferred thickness range of the absorber layer 40 varies on the material forming the absorber layer 40. For example, when the absorber layer is a TaN based one, such as one containing TaN or TaNH, the thickness is preferably in a range of from 50 to 90 nm. When the absorber layer is a TaPd based one, such as one containing TaPd or TaPdN, the thickness is preferably in a range of from 40 to 60 nm.

The absorber layer 40 configured as described above may be formed by use of a sputtering method, such as a magnetron sputtering method or an ion beam sputtering method.

By forming the absorber layer 40 by use of a sputtering method, the fiducial marks formed on the front side of the reflective multilayer film 20 are transferred onto the absorber layer 40 to be formed as concave transferred marks 50 on the front side of the absorber layer 40.

As described above, in the reflective mask blank according to the present invention, the inclination angle $\alpha$ of the concave portion forming each of the fiducial marks 30 is greater than the inclination angle $\beta$ of the concave portion forming each of the marks transferred from the fiducial marks 30 (transferred marks 50), and the difference between the inclination angle $\beta$ of the concave portion forming each of the transferred marks 50 and the inclination angle $\alpha$ of the concave portion forming each of the corresponding fiducial marks 30 (inclination angle $\beta$–inclination angle $\alpha$) is at least 10°.

In order to set the value of (inclination angle $\beta$–inclination angle $\alpha$) at at least 10°, the formation of the absorber layer 40 by a sputtering method is carried out under a pressure of preferably at most 0.3 Pa ($3.0 \times 10^{-1}$ Pa), more preferably at most 0.2 Pa ($2.0 \times 10^{-1}$ Pa), furthermore preferably at most 0.1 Pa ($1.0 \times 10^{-1}$ Pa).

As described above, the value of (inclination angle $\beta$–inclination angle $\alpha$) is preferably at least 15°, more preferably at least 20°. In order to further increase the value of (inclination angle $\beta$–inclination angle $\alpha$), it is preferred to supply a high input power, to reduce the distance between a target and a substrate, to place a cathode in a strong magnet field or to carry out film deposition at a low temperature.

An example of the conditions under which the absorber layer 40 configured as described above is formed is shown below.

For example, when a magnetron sputtering method is utilized to form a TaNH film as the absorber layer 40, the TaNH film is preferably deposited under the following conditions:

Target: Ta target
Sputtering gas: mixed gas of Ar, $N_2$ and $H_2$ ($H_2$ gas having a concentration from 1 to 30 vol %, $N_2$ gas having a concentration of from 5 to 75 vol % and Ar gas having a concentration from 10 to 94 vol %)
Gas pressure: from $0.5 \times 10^{-1}$ Pa to $3.0 \times 10^{-1}$ Pa
Input power: from 300 to 2,000 W
Deposition rate: from 0.5 to 60 nm/min
Film thickness: from 20 to 90 nm.

When a magnetron sputtering method is utilized to form a TaPdN film as the absorber layer 40, the TaPdN film is preferably deposited under the following conditions:

Target: Ta target and Pd target, or compound target containing Ta and Pd
Sputtering gas: mixed gas of Ar and $N_2$ ($N_2$ gas having a concentration of from 1 to 80 vol %, and Ar gas having a concentration from 5 to 95 vol %)
Gas pressure: from $1.0 \times 10^{-1}$ Pa to $3.0 \times 10^{-1}$ Pa
Input power: from 30 to 1,000 W
Deposition rate: from 0.5 to 60 nm/min
Film thickness: from 20 to 50 nm.

The reflective mask blank according to the present invention may have a low reflective layer formed on the absorber layer 40 for inspection light used for mask pattern inspection.

The low reflective layer is made of a film which has a low reflectivity with respect to inspection light used for mask pattern inspection. When an EUV mask is produced, the absorber layer is patterned, followed by inspecting whether the pattern is formed as designed or not. The mask pattern inspection utilizes an inspection system which normally uses, as inspection light, light having a wavelength of about 257 nm. In other words, the inspection is carried out based on the difference in reflectivity between parts of a front side exposed by partial stripping of the absorber layer caused by patterning and the remaining parts of the front side of the absorber layer left without being stripped by patterning. The former is the front side of the reflective layer or the front side of the protective layer, normally the front side of the protective layer. This means that when the difference in reflectivity between the front side of the reflective layer or the front side of the protective layer and the front side of the absorber layer with respect to the wavelength of the inspection light is small, contrast is deteriorated at the time of inspection, making it impossible to carry out the inspection accurately. When the difference in reflectivity between the front side of the reflective layer or the front side of the protective layer and the front side of the absorber layer with respect to the wavelength of the inspection light is small, the low reflective layer can be formed to obtain good contrast for inspection. When the low reflective layer is formed on the absorber layer, the low reflective layer has a maximum reflectivity of preferably at most 15%, more preferably at most 10%, furthermore preferably at most 5% with respect to the wavelength of the inspection light when the low reflective layer has the front side irradiated with a ray in the wavelength range of the inspection light.

The low reflective layer is preferably made of a material having a low refractive index than the absorber layer with respect to the wavelength of the inspection light in order to attain the above-mentioned characteristic.

The low reflective layer that meets this characteristic is one containing at least one kind selected from the group consisting of tantalum (Ta), palladium (Pd), chromium (Cr), silicon (Si) and hafnium (Hf) and at least one kind selected from the group consisting of oxygen (O) and nitrogen (N). Preferred examples of the low reflective layer include a TaPdO layer, a TaPdON layer, a TaON layer, a CrO layer, a CrON layer, a SiON layer, a SiN layer, a HfO layer and a HfON layer.

The total content of Ta, Pd, Cr, Si and Hf in the low reflective layer is preferably from 10 to 55 at %, particularly from 10 to 50 at % for the reason why the optical characteristics to the wavelength region of light for pattern inspection is made controllable.

The total content of O and N in the low reflective layer is preferably from 45 to 90 at %, particularly from 50 to 90 at % for the reason why the optical characteristics to the wavelength region of the light for pattern inspection is made controllable. The total content of Ta, Pd, Cr, Si, Hf, O and N in the low reflective layer is preferably from 95 to 100 at % more preferably from 97 to 100 at %, furthermore preferably from 99 to 100 at %.

When the low reflective layer is formed on the absorber layer, the absorber layer and the low reflective layer had a total thickness of preferably from 40 to 90 nm. Further, when the low reflective layer has a greater thickness than the absorber layer, the EUV light absorption characteristics in the absorber layer could reduce, the low reflective layer preferably has a smaller thickness than the absorber layer. From this point of view, the low reflective layer has a thickness of preferably from 1 to 30 nm, more preferably from 1 to 20 nm.

The low reflective layer configured as described above may be formed by use of a sputtering method, such as magnetron sputtering method or an ion beam sputtering method.

When the low reflective layer is formed by use of a sputtering method, the fiducial marks 30 formed on the front side of the reflective multilayer film 20 are further transferred onto the low reflective layer to be formed as concave transferred marks on the front side of the low reflective layer. Since the low reflective layer has a smaller thickness as described above, it is supposed that the inclination angle of the transferred marks formed on the front side of the low reflective layer has substantially the same value as the inclination value of the transferred marks formed on the front side of the absorber layer.

The low reflective layer configured described above may be formed by use of a sputtering method using a target containing at least one of Ta, Pd, Cr, Si and Hf. As the target, either one of a metal target containing at least two kinds of metal described above and a compound target is applicable.

The use of a metal target containing at least two kinds of metal is advantageous in terms of controlling the components contained in the low reflective layer. When a metal target containing at least two kinds of metal is used, it is possible to control the components contained in the absorber layer by controlling the input power to the target. On the other hand, a compound target is used, the composition of the target is preferably controlled in advance such that the formed low reflective layer has a desired composition.

The sputtering method using such a target may be carried out in an inert gas atmosphere as in the sputtering method for the purpose of forming the absorber layer.

When the low reflective layer contains O, the sputtering method is carried out in an inert gas atmosphere containing $O_2$ and at least one of He, Ar, Ne, Kr and Xe. When the low reflective layer contains N, the sputtering method is carried out in an inert gas atmosphere containing $N_2$ and at least one of He, Ar, Ne, Kr and Xe. When the low reflective layer contains O and N, the sputtering method is carried out in an inert gas atmosphere containing $O_2$ and $N_2$, and at least one of He, Ar, Ne, Kr and Xe.

Although the specific conditions for carrying out a sputtering method varies on a used target or the composition of the inert gas atmosphere for carrying out the sputtering method, the sputtering method may be carried out under the following conditions in any one of the above-mentioned cases.

The conditions for forming the low reflective layer are described below in a case where the inert gas atmosphere is a mixed gas atmosphere of Ar and $O_2$.

Conditions for Forming Low Reflective Layer

Gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa Sputtering gas: mixed gas of Ar and $O_2$ ($O_2$ gas having a concentration of from 3 to 80 vol %, preferably from 5 to 60 vol %, more preferably from 10 to 40 vol %)

Input power: from 30 to 1,000 W, preferably from 50 to 750 W, more preferably from 80 to 500 W Deposition rate: from 0.01 to 60 nm/min, preferably from 0.05 to 45 nm/min, more preferably from 0.1 to 30 nm/min When an inert gas other than the Ar gas or an inert gas containing plural substances is used, the total concentration of such an inert gas is set within the same concentration range as the concentration of the Ar gas. When the inert gas atmosphere contains $N_2$, the concentration of $N_2$ is set within the same concentration range as the above-mentioned oxygen concentration. When the inert gas atmosphere contains $N_2$ and $O_2$, the total concentration is set within the same concentration range as the above-mentioned oxygen concentration.

The reason why the formation of the low reflective layer on the absorber layer is preferred in the reflective mask blank according to the present invention is that the light for pattern inspection and the EUV light having different wavelengths. From this point of view, when the EUV light (having a wavelength of about 13.5 nm) is used as the light for pattern inspection, it is supposed that it is not necessary to form the low reflective layer on the absorber layer. The latest trend is that the wavelength of inspection light shifts toward a short wavelength as pattern dimensions are made finer. It is supposed that the wavelength of inspection would shift to 193 nm, further 13.5 nm in the future. When the inspection light has a wavelength of 13.5 nm, it is supposed that it is not necessary to form the low reflective layer on the absorber layer.

The reflective mask blank according to the present invention may include a functional film known in the field of the EUVL reflective mask blank in addition to the above-mentioned layers. One of the specific examples of such a functional film is a high dielectric coating applied to the back side of a substrate to facilitate electrostatic chucking of the substrate disclosed in e.g. WO 00/75727 A2. The back side of the substrate means a side of the substrate 10 remote from the reflective multilayer film 20 in FIG. 1. In the high dielectric coating applied to the back side of a substrate for this purpose, the electrical conductivity and the thickness of the materials forming the coating are selected to have a sheet resistance of at least 100 Ω/square. The materials forming the high dielectric coating may be widely selected from ones disclosed in known publications. For example, the high dielectric coating disclosed in the international publication, specifically a coating including silicon, TiN, molybdenum, chromium and TaSi, is applicable. The high dielectric coating may have a thickness of from 10 to 1,000 nm for example.

The high dielectric coating may be formed by a known film deposition method, such as a sputtering method including a magnetron sputtering method and an ion beam sputtering method, a CVD method, a vacuum deposition method, and an electroplating method.

EXAMPLES

Now, the present invention will be further described in reference to Examples.

Example 1

In this Example, a reflective mask blank as shown in FIGS. 3 and 4 are produced.

As the substrate for film deposition 10, a $SiO_2$—$TiO_2$ based glass substrate (having outer dimensions of 6 inch, i.e. 152.4 mm square and a thickness of 6.3 mm) is used. The glass substrate has a thermal expansion coefficient of $0.2 \times 10^{-7}$/° C., a Young's modulus of 67 GPa, a Poisson ratio of 0.17 and a specific rigidity of $3.07 \times 10^7$ $m^2/s^2$. The glass substrate is polished to have a smooth surface with at most 0.15 nm in Rq and have a flatness of at most 100 nm.

The substrate 10 has a high dielectric coating a sheet resistance of 100 Ω/square (not shown) applied on the back side by depositing a Cr film having a thickness of 100 nm by use of a magnetron sputtering method.

The Cr film formed by the above-mentioned procedure is used to fix the substrate 10 (having outer dimensions of 6 inch, i.e. 152.4 mm square and a thickness of 6.3 mm) to an ordinary planar electrostatic chuck, and Mo films and Si films are alternately deposited in 50 cycles, respectively, by an ion beam sputtering method to form a Mo/Si reflective multilayer film (reflective multilayer film 20) having a total film thickness of 340 nm ((2.3 nm+4.5 nm)×50). The reflective multilayer film 20 has an exposure area having dimensions of 132 mm by 104 mm for patterning. The reflective multilayer film 20 has concave fiducial marks 30 on a part of the front side thereof outside the exposure area, specifically, at four corners of the reflective multilayer film 20 by a FIB method (see FIGS. 1 and 2).

These fiducial marks 30 have a planar form in a cross shape as shown in FIG. 2. The cross shape is dimensioned such that each of the two elongated rectangular shape forming the cross shape has a length of 1 mm and a width of 1 µm.

The depth of the concave portion forming each of the fiducial marks 30 is measured by use of an atomic force microscope (AFM).

The depth of the concave portion is 78 nm.

Next, a TaN layer is formed as the absorber layer 40 on the reflective multilayer film 20 by use of a magnetron sputtering to obtain the reflective mask blank as shown in FIGS. 3 and 4.

The conditions for film deposition of the TaN layer are as follows.

Conditions for Forming TaN Layer
  Target: Ta target
  Sputtering gas: mixed gas of Ar and $N_2$ (Ar: 86 vol %, $N_2$: 14 vol %, gas pressure: 0.1 Pa)
  Film thickness t: 80 nm The formation of the absorber layer 40 by use of the sputtering method causes the fiducial marks 30 formed on the front side of the reflective multilayer film 20 to be transferred onto the absorber layer 40 such that the fiducial marks are formed as concave transferred marks 50 on the front side of the absorber layer 40. Each of the transferred marks 50 has a planar shape in a cross shape as shown in FIG. 4.

The depth of the concave portion forming each of the transferred marks 50 is measured by use of the atomic force microscope (AFM). The depth of the concave portion forming each of the transferred marks 50 is 78 nm.

The reflective mask obtained by the above-mentioned procedure is evaluated in the following procedure in terms of the detectability of the transferred marks 50. The evaluation results are shown in Table 1 listed below.

The evaluation of the detectability of the transferred marks are carried out by measurement of line edge roughness (LER) in accordance with Semiconductor Equipment and Material International standards (SEMI standards). A Critical Dimension-Scanning Microscope (CD-SEM) is used to observe an image from just above each of the transferred marks to measure values of 3 σ (nm) in the LER of the edge portion of each of the transferred marks.

The evaluation criteria are as follows:
  "Excellent": 3σ≤8 nm
  "Good": 8 nm<3σ≤40 nm
  "Bad": 40 nm<3σ

In the cases having an evaluation criterion labeled "Good", the transferred marks are detected even by use of an electron-beam lithography system (acceleration voltage: 50 kV). In the case having an evaluation criterion labeled "Excellent", the transferred marks are detected even by use of the electron-beam lithography system (acceleration voltage: 50 kV), and the reproducibility of the detection positions is also good.

Further, with respect to the reflective mask obtained by the above-mentioned procedure, the inclination angle α of the concave portion forming each of the fiducial marks 30 and the inclination angle β of the concave portion forming each of the corresponding transferred marks 50 are measured by image processing based on cross-sectional SEM images according to the above-mentioned procedure. The inclination angle α of the concave portion forming each of the fiducial marks 30 is 34°, the inclination angle β of the concave portion forming each of the transferred marks 50 is 74°, and the difference between the inclination angle β of the concave portion forming each of the transferred marks 50 and the inclination angle α of the concave portion forming each of the corresponding fiducial marks 30 (inclination angle β–inclination angle α) is 40°.

Example 2

The same procedure as Example 1 is carried out except that the inclination angle α of the concave portion forming each of the fiducial marks 30 formed on the front side of a reflective multilayer film 20 by use of the FIB method is 32°, that the concave portion has a depth of 80 nm, and, that the input power among the conditions in deposition of a TaN layer as the absorber layer is a half (½ P) of the one (P) in Example 1. The inclination angle β of the concave portion forming each of the transferred marks 50 is 63°, and the concave portion has a depth of 80 nm. The difference between the inclination angle β of the concave portion forming each of the transferred marks 50 and the inclination angle α of the concave portion forming each of the corresponding fiducial marks 30 (inclination angle β–inclination angle α) is 31°.

Example 3

The same procedure as Example 1 is carried out except that the inclination angle α of the concave portion forming each of the fiducial marks 30 formed on the front side of a reflective multilayer film by use of the FIB method is 31°, that the concave portion has a depth of 81 nm, and that the input power in the conditions for deposition of a TaN as the absorber layer 40 is ¼ (¼ P) of the one (P) in Example 1. The inclination angle β of the concave portion forming each of the transferred marks 50 is 55°, and the concave portion has a depth of 81 nm. The difference between the inclination angle β of the concave portion forming each of the transferred mark 50 and the inclination angle α of the concave portion forming each of the corresponding fiducial marks 30 (inclination angle β–inclination angle α) is 24°.

Example 4

The same procedure as Example 1 is carried out except that the inclination angle α of the concave portion forming each of the fiducial marks 30 formed on the front side of a reflective multilayer film 20 by use of the FIB method is 30°, that the concave portion has a depth of 79 nm, and that the gas pressure and the input power among the conditions for deposition of a TaN layer as the absorber layer 40 are 0.3 Pa and a half (½ P) of the one (P) in Example 1, respectively. The inclination angle β of the concave portion forming each of the transferred marks 50 is 41°, and the concave portion has a depth of 79 nm. The difference between the inclination angle β of the concave portion forming each of the transferred marks 50 and the inclination angle α of the concave portion forming each of the corresponding fiducial marks 30 (inclination angle β–inclination angle α) is 11°.

Example 5

The same procedure as Example 1 is carried out except that the inclination angle α of the concave portion forming each of the fiducial marks 30 formed on the front side of a reflective multilayer film 20 by use of the FIB method is 28°, that the concave portion has a depth of 78 nm, and that the gas pressure, the input power and the film thickness of a TaN layer among the conditions for depositions of the TaN layer as the absorber layer 40 are 0.3 Pa, a half (½ P) of the one (P) in Example 1 and 40 nm, respectively. The inclination angle β of the concave portion defining each of the transferred marks 50 is 38°, and the concave portion has a depth of 78 nm. The difference between the inclination angle β of the concave portion forming each of the transferred marks 50 and the inclination angle α of the concave portion forming each of the corresponding fiducial marks 30 (inclination angle β–inclination angle α) is 10°.

Comparative Example 1

The same procedure as Example 1 is carried out except that the concave portion defining each of the fiducial marks 30 formed on the front side of the reflective multilayer film 20 by use of the FIB method has an inclination angle of 26°, that the concave portion has a depth of 82 nm, and that the gas pressure and the input powder among the deposition conditions of the TaN layer as the absorber layer 40 are 0.3 Pa and ¼ (¼ P) of the one (P) in Example 1, respectively. The concave portion defining each of the transferred marks 50 has an inclination angle β of 30°, and the concave portions has a depth of 82 nm. The difference between the inclination angle β of the concave portion forming each of the transferred marks 50 and the inclination angle α of the concave portion of each of the corresponding fiducial marks 30 (inclination angle β–inclination angle α) is 4°.

Comparative Example 2

The same procedure as Example 1 is carried out except that the concave portion defining each of the fiducial marks 30 formed on the front side of the reflective multilayer film 20 by use of the FIB method has an inclination angle of 25°, that the concave portion has a depth of 81 nm, and that the gas pressure and the input powder among the deposition conditions of the TaN layer as the absorber layer 40 are 0.5 Pa and ½ (½ P) of the one (P) in Example 1, respectively. The concave portion defining each of the transferred marks 50 has an inclination angle β of 26°, and the concave portions has a depth of 81 nm. The difference between the inclination angle β of the concave portion defining each of the transferred marks 50 and the inclination angle α of the concave portion defining each of the corresponding fiducial marks 30 (inclination angle β–inclination angle α) is 1°.

Comparative Example 3

The same procedure as Example 1 is carried out except that the concave portion defining each of the fiducial marks 30 formed on the front side of the reflective multilayer film 20, which is processed for a long period of time with a reduced probe current during implementation of the FIB method, has an inclination angle α of 73°, that the concave portion has a depth of 80 nm, and that the gas pressure and the input power among the deposition conditions of the TaN layer as the absorber layer 40 are 0.3 Pa and ½ (½ P) of the one (P) in Example 1, respectively. The concave portion defining each of the transferred marks 50 has an inclination angle β of 85°, and the concave portion has a depth of 80 nm. The difference between the inclination angle β of the concave portion defining each of the transferred marks 50 and the inclination angle β of the concave portion defining each of the corresponding fiducial marks 30 (inclination angle β–inclination angle α) is 12°.

TABLE 1

| | Conditions for forming TaN layer | | | | | Detectability |
| | Gas pressure (Pa) | Input power (W) | Inclination angle α | Inclination angle β | β − α | of transferred mark |
|---|---|---|---|---|---|---|
| Ex. 1 | 0.1 | P | 34° | 74° | 40° | "Good" |
| Ex. 2 | 0.1 | ½ P | 32° | 63° | 31° | "Excellent" |
| Ex. 3 | 0.1 | ¼ P | 31° | 55° | 24° | "Excellent" |
| Ex. 4 | 0.3 | ½ P | 30° | 41° | 11° | "Good" |
| Ex. 5 | 0.3 | ½ P | 28° | 38° | 10° | "Good" |
| Comp. Ex. 1 | 0.3 | ¼ P | 26° | 30° | 4° | "Bad" |
| Comp. Ex. 2 | 0.5 | ½ P | 25° | 26° | 1° | "Bad" |
| Comp. Ex. 3 | 0.3 | ½ P | 73° | 85° | 12° | "Bad" |

As clearly from Table 1, Examples 1 to 5, where the inclination angle β is from 35 to 80°, and (inclination angle β–inclination angle α) is at least 10°, are labeled "Good" or "Excellent" with respect to the detectability of the transferred marks. In particular, Examples 2 and 3, where the inclination angle β is from 50 to 65°, are labeled "Excellent" with respect to the detectability of the transferred marks.

Comparative Examples 1 and 2, where the inclination angle β is less than 35°, and (inclination angle β–inclination angle α) is less than 10°, are labeled "Bad" with respect to the detectability of the transferred marks.

In Comparative Example 3, where the concave portion defining each of the fiducial marks 30 is processed for a long period of time with a probe current reduced during implementation of the FIB method to provide the concave portion with an inclination angle α of 73°, the long-time processing by the FIB method damages the front side with the fiducial marks formed thereon. This reveals that the detectability of the transferred marks is labeled "Bad", which means the presence of many defects in the produced reflective mask blank.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2015-184035 filed on Sep. 17, 2015 including specification, claims, drawings and summary is incorporated herein by reference in its entirety.

What is claimed is:

1. A reflective mask blank, which includes a substrate, a reflective multilayer film for reflecting exposure light, and an absorber layer for absorbing the exposure light in this order;

the reflective multilayer film having at least three fiducial marks formed in a concave shape in an area outside an exposure area for patterning the reflective multilayer film on a front side thereof, each of the fiducial marks including a concave portion having an inclination angle $\alpha$, the absorber layer having a film thickness of from 40 to 90 nm;

the absorber layer having transferred marks formed in a concave shape on a front side thereof, the transferred marks being transferred from the at least three fiducial marks, each of the transferred marks including a concave portion having an inclination angle $\beta$ of from 35 to 80°; and a difference between the inclination angle $\beta$ and the inclination angle $\alpha$ (inclination angle $\beta$–inclination angle $\alpha$) being at least 10°.

2. The reflective mask blank according to claim 1, wherein the concave portion of each of the transferred marks has a depth of at least 50 nm.

3. The reflective mask blank according to claim 1, wherein the inclination angle $\alpha$ is from 25 to 45°.

4. The reflective mask blank according to claim 2, wherein the inclination angle $\alpha$ is from 25 to 45°.

5. The reflective mask blank according to claim 1, wherein the at least three fiducial marks are not present on a single imaginary linear line on the front side of the reflective multilayer film.

6. The reflective mask blank according to claim 2, wherein the at least three fiducial marks are not present on a single imaginary linear line on the front side of the reflective multilayer film.

7. The reflective mask blank according to claim 3, wherein the at least three fiducial marks are not present on a single imaginary linear line on the front side of the reflective multilayer film.

8. The reflective mask blank according to claim 4, wherein the at least three fiducial marks are not present on a single imaginary linear line on the front side of the reflective multilayer film.

9. A process for producing the reflective mask blank defined in claim 1, comprising using a FIB (Forced Ion Beam) method or a dry etching process to form at least three concave fiducial marks on a reflective multilayer film in an area outside an exposure area for patterning the reflective multilayer film on a front side of the reflective multilayer film; and forming an absorber layer on the reflective multilayer film by sputtering after formation of the at least three fiducial marks such that the at least three fiducial marks are transferred onto the absorber layer.

10. The process according to claim 9, wherein the forming of the absorber layer by sputtering is carried out under a pressure of at most 0.3 Pa.

* * * * *